US009041082B2

(12) United States Patent
Dubourdieu et al.

(10) Patent No.: US 9,041,082 B2
(45) Date of Patent: May 26, 2015

(54) ENGINEERING MULTIPLE THRESHOLD VOLTAGES IN AN INTEGRATED CIRCUIT

(75) Inventors: Catherine Anne Dubourdieu, New York, NY (US); Martin Michael Frank, Dobbs Ferry, NY (US); Vijay Narayanan, New York, NY (US)

(73) Assignees: International Business Machines Corporation, Armonk, NY (US); Centre National de la Recherche Scientifique, Paris (FR)

(*) Notice: Subject to any disclaimer, the term of this patent is extended or adjusted under 35 U.S.C. 154(b) by 381 days.

(21) Appl. No.: 12/899,691

(22) Filed: Oct. 7, 2010

(65) Prior Publication Data

US 2012/0086059 A1 Apr. 12, 2012

(51) Int. Cl.

*H01L 21/02* (2006.01)
*H01L 21/28* (2006.01)
*H01L 21/8234* (2006.01)
*H01L 29/78* (2006.01)

(52) U.S. Cl.

CPC .. *H01L 21/28291* (2013.01); *H01L 21/823412* (2013.01); *H01L 21/823462* (2013.01); *H01L 29/78* (2013.01); *H01L 29/7843* (2013.01)

(58) Field of Classification Search

CPC .................. H01L 29/7843; H01L 21/823857; H01L 21/823462; H01L 21/28291
USPC .......................... 257/295, E21.001, E29.324
See application file for complete search history.

(56) References Cited

U.S. PATENT DOCUMENTS 5,471,417 A 11/1995 Krautschneider et al.
6,067,244 A 5/2000 Ma et al.
6,632,729 B1 * 10/2003 Paton .......................... 438/535
6,894,330 B2 5/2005 Bachhofer et al.
6,911,404 B2 6/2005 Wieczorek et al.
2005/0186722 A1 * 8/2005 Cheng et al. ................ 438/199
2006/0246647 A1 * 11/2006 Visokay et al. .............. 438/199
2007/0262391 A1 * 11/2007 Jin ............................. 257/369
2008/0003734 A1 * 1/2008 Chuang et al. ............... 438/199
2008/0119019 A1 * 5/2008 Han et al. ................... 438/197

(Continued)

FOREIGN PATENT DOCUMENTS

JP 2004296505 10/2004
JP 2007099618 4/2007

OTHER PUBLICATIONS

Verghese et al., Modeling Stress-Induced Variability Optimizes IC Timing Performance, cadence, 1-9.*

(Continued)

*Primary Examiner* — Kenneth Parker
*Assistant Examiner* — David Chen
(74) *Attorney, Agent, or Firm* — Law Offices of Ira D. Blecker, P.C.

(57) ABSTRACT

An integrated circuit and method for forming an integrated circuit. There are at least three field-effect transistors with at least two of the field-effect transistors having the same electrically insulating material which is ferroelectric when unstrained or is capable of being ferroelectric when strain is induced. It is optional for the third field-effect transistor to have an electrically insulating material which is ferroelectric when unstrained or is capable of being ferroelectric when strain is induced. The at least three field-effect transistors are strained to varying amounts so that each of the three field-effect transistors has a threshold voltage, Vt, which is different from the Vt of the two other field-effect transistors.

9 Claims, 5 Drawing Sheets

(56) References Cited

U.S. PATENT DOCUMENTS

| | | | | |
|---|---|---|---|---|
| 2008/0149922 | A1 | 6/2008 | Lin et al. | |
| 2008/0237732 | A1* | 10/2008 | Mori et al. | 257/371 |
| 2008/0277733 | A1* | 11/2008 | Fukutome | 257/368 |
| 2008/0283751 | A1 | 11/2008 | Kymissis | |
| 2008/0303068 | A1* | 12/2008 | Grill et al. | 257/288 |
| 2008/0308872 | A1* | 12/2008 | Bu et al. | 257/369 |
| 2009/0108373 | A1 | 4/2009 | Frank et al. | |
| 2010/0133620 | A1* | 6/2010 | Richter | 257/368 |
| 2010/0176457 | A1* | 7/2010 | Jin | 257/369 |

OTHER PUBLICATIONS

Rung-Bin Lin, Chapter 2: CMOS Transistor Theory.*

Claude Ederer et al., "Effect of Epitaxial Strain on the Spontaneous Polarization of Thin Film Ferroelectrics", Physical Review Letters; vol. 95, pp. 257601-1 to 257601-4, Dec. 16, 2005.

Craig J. Fennie et al, "Magnetic and Electric Phase Control in Epitaxial EuTiO3 from First Principles", Physical Review Letters, vol. 97, pp. 267602-1 to 267602-4, Dec. 31, 2006.

J.H.Haeni et al., "Room-temperature ferroelectricity in strained SrTiO3", Nature, pp. 758-761, 2004.

Yih-Yin Lin et al., "Study of charge control and gate tunneling in a ferroelectric-oxide-silicon field effect transistor: Comparison with a conventional metal-oxide-silicon structure", J. Applied Physics, vol. 89, No. 3, pp. 1856-1860, Feb. 1, 2001.

V. Narayanan, "Band-Edge High-Performance High-k/Metal Gate n-MOSFETs using Cap Layers Containing Group IIA and IIIB Elements with Gate-First Processing for 45 nm and Beyond", Digest of Technical Papers, 2006 Symposium on VLSI Technology, pp. 178-179.

H.Y.Yu et al., "Transistor threshold voltage modulation by Dy2O3 rare-earth oxide capping: The role of bulk dielectrics charge", Applied Physics Letters,vol. 93, 263502, 2008.

* cited by examiner

ENGINEERING MULTIPLE THRESHOLD VOLTAGES IN AN INTEGRATED CIRCUIT

RELATED APPLICATION

This application is related to "Controlling ferroelectricity in dielectric films by process induced uniaxial stress", U.S. patent application Ser. No. 12/753,270, filed Apr. 2, 2010, the disclosure of which is incorporated by reference in its entirety herein.

FIELD OF THE INVENTION

The present invention relates to integrated circuits, and more particularly, to techniques for combining field-effect transistors (FETs) in an integrated circuit having different threshold voltage requirements from one another.

BACKGROUND OF THE INVENTION

Integrated circuits now commonly include a wide variety of different transistor types in combination with one another. By way of example, random access memory transistors, such as static random access memory (SRAM) or dynamic random access memory (DRAM) transistors, are in many configurations used in combination with a variety of logic transistors. A challenge, however, associated with integrating different transistors is that each type of transistor generally requires a threshold voltage (Vt) that is different from what the other types of transistors require. For example, with integrated circuit configurations that combine SRAM and logic transistors, the SRAM transistors typically require a higher Vt than their logic counterparts. This Vt difference is due to the relatively lower power requirements of SRAM transistors as compared to logic transistors.

In conventional designs, these different Vt requirements may be addressed through doping. Specifically, extra doping steps are performed to alter the Vt of the SRAM transistors relative to the logic transistors, and vice versa. This approach, however, has a notable drawback. Since the Vt of the transistors is determined through doping, the doping must be consistent from one device to another to attain consistent Vt. Dopant fluctuations, which can occur in a significant number of devices produced, lead to variability in the transistors which leads to variability in the devices and thus affects device performance. As device feature sizes are scaled, the effects of dopant fluctuations and device variability become even more pronounced.

Therefore, improved techniques for combining transistors having different Vt requirements would be desirable.

BRIEF SUMMARY OF THE INVENTION

The various advantages and purposes of the present invention as described above and hereafter are achieved by providing, according to a first aspect of the invention, an integrated circuit which includes a first field-effect transistor having a gate stack including a first electrically insulating material and a first level of strain, S1, being induced in the gate stack, the first field-effect transistor having a first threshold voltage, $Vt_1$; a second field-effect transistor having a gate stack including a second electrically insulating material and a second level of strain, S2, being induced in the gate stack, the second field-effect transistor having a second threshold voltage, $Vt_2$; and a third field-effect transistor having a gate stack and a third level of strain, S3, being induced in the gate stack, the third field-effect transistor having a third threshold voltage, $Vt_3$, wherein the first and second electrically insulating materials are the same electrically insulating material and at least one of the first and second electrically insulating materials is ferroelectric in the first and second field-effect transistors and wherein the first and second electrically insulating materials and the first, second, and third levels of strain S1, S2, and S3, are configured to shift at least one of the first, second, and third threshold voltages $Vt_1$, $Vt_2$, and $Vt_3$ relative to each other by a predetermined amount such that $Vt_1$, $Vt_2$, and $Vt_3$ are all set to different predetermined values.

According to a second aspect of the invention, there is provided an integrated circuit including a first field-effect transistor having a gate stack including a first ferroelectric material and a first level of strain, S1, being induced in the gate stack, the first field-effect transistor having a first threshold voltage, $Vt_1$; a second field-effect transistor having a gate stack including a second ferroelectric material and a second level of strain, S2, being induced in the gate stack, the second field-effect transistor having a second threshold voltage, $Vt_2$; and a third field-effect transistor having a gate stack and a third level of strain, S3, being induced in the gate stack, the third field-effect transistor having a third threshold voltage, $Vt_3$, wherein the first and second ferroelectric materials are the same and wherein the first and second ferroelectric materials and the first, second and third levels of strain, S1, S2 and S3 are configured to shift at least $Vt_1$ and $Vt_2$ relative to each other and to $Vt_3$ by a predetermined amount such that $Vt_1$, $Vt_2$ and $Vt_3$ are all set to different predetermined values.

According to a third aspect of the invention, there is provided an integrated circuit including a first field-effect transistor having a gate stack including a first electrically insulating material that is ferroelectric when strain is induced to a first predetermined level, the first field-effect transistor having a first threshold voltage, $Vt_1$; a second field-effect transistor having a gate stack including a second electrically insulating material that is ferroelectric when strain is induced to a second predetermined level, the second field-effect transistor having a second threshold voltage, $Vt_2$; and a third field-effect transistor having a gate stack, the third field-effect transistor having a third threshold voltage, $Vt_3$, wherein the first and second electrically insulating materials are the same and the first electrically insulating material is strained to at least the first predetermined level so that the first electrically insulating material is ferroelectric while the second electrically insulating material is unstrained or strained to below the second predetermined level so that the second electrically insulating material is not ferroelectric and wherein the first and second electrically insulating materials are configured to shift $Vt_1$ relative to $Vt_2$ and $Vt_3$ by a predetermined amount such that $Vt_1$, $Vt_2$ and $Vt_3$ are all set to different predetermined values.

According to a fourth aspect of the invention there is provided a method of forming an integrated circuit which includes the steps of: selecting a first field-effect transistor having a gate stack including a first electrically insulating material; imposing a first level of stress, S1, on the gate stack, the first field-effect transistor having a first threshold voltage, $Vt_1$; selecting a second field-effect transistor having a gate stack including a second electrically insulating material; imposing a second level of stress, S2, on the gate stack, the second field-effect transistor having a second threshold voltage, $Vt_2$; selecting a third field-effect transistor having a gate stack; imposing a third level of stress, S3, on the gate stack, the third field-effect transistor having a third threshold voltage, $Vt_3$, wherein the first and second electrically insulating materials are the same electrically insulating material and at least one of the metal compounds is ferroelectric in the first and second field-effect transistors and wherein the first, second and third levels of stress are configured to shift at least one of $Vt_1$, $Vt_2$ and $Vt_3$ relative to each other by a predetermined amount such $Vt_1$, $Vt_2$ and $Vt_3$ are all stabilized to different predetermined values.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
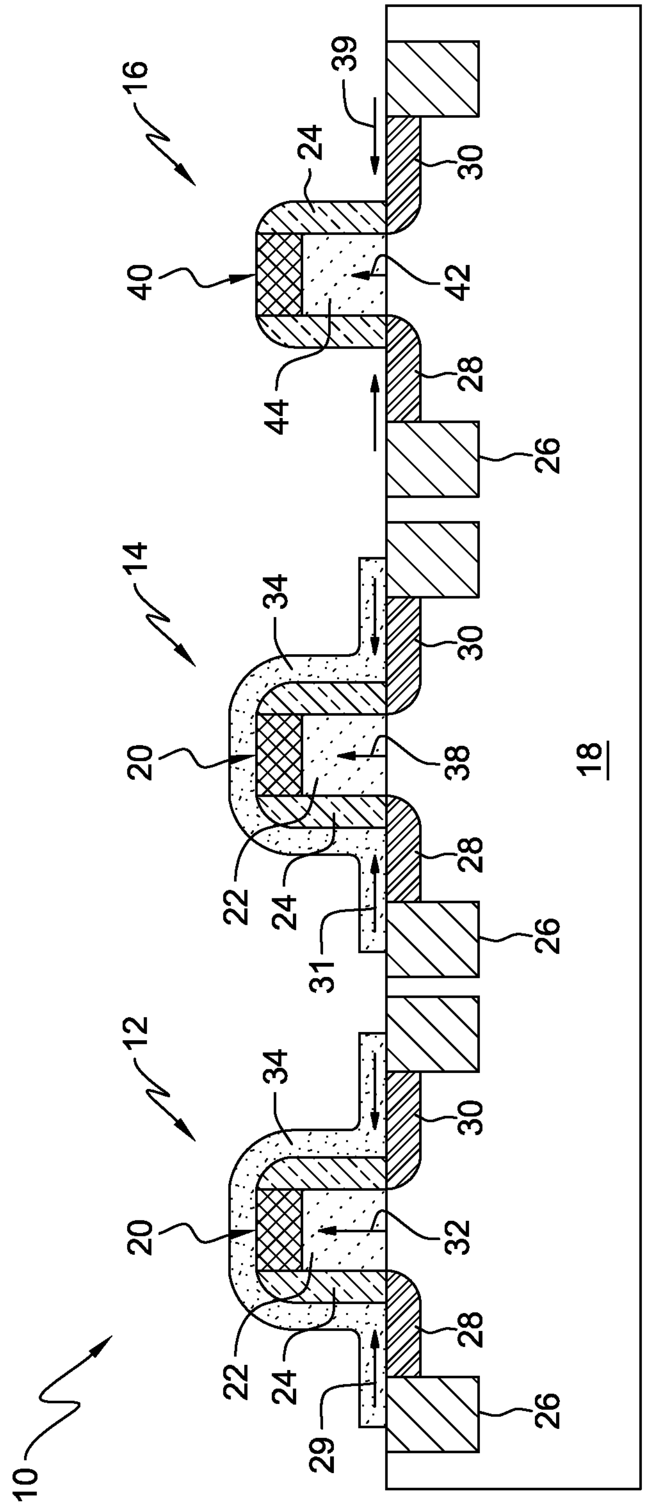
FIG. 1 is a cross sectional view of an integrated circuit having a gate stack including a ferroelectric material according to a first embodiment of the present invention.

Disclosed herein are structures and a method of forming a circuit with semiconductor devices having a gate stack including a ferroelectric material. When ferroelectric materials are stressed to different stress levels, the different stress levels give rise to different strain levels which give rise to different polarization states and thus to different Vt values.

The ferroelectric materials of the present invention are electrically insulating materials that exhibit ferroelectricity when unstrained or exhibit ferroelectricity when strain is induced above a certain threshold level. The ferroelectric materials of the present invention may have a Vt value when they are not stressed and this Vt value is shifted (i.e., changed) to a different Vt value when the ferroelectric materials are strained. As noted above, Vt varies depending on the stress level applied. Thus, as further explained in the following embodiments of the present invention, a range of Vt values may be obtained by applying different levels of stress (and sometimes no stress) to the ferroelectric materials resulting in FETs having a spread of stabilized Vt values that vary from each other by a predetermined amount. Electrically insulating materials useful in the present invention include, but are not limited to, triglycine sulfate (TGS), $BaTiO_3$, $Pb[Zr_xTi_{1-x}]O_3$ (PZT), $SrBi_2Ta_2O_9$ (SBT), $SrTiO_3$ (STO), $Ba_{1-x}Sr_xTiO_3$ (BST), $PbTiO_3$, $EuTiO_3$, $CaMnO_3$ (CMO) and $BiFeO_3$. Of these electrically insulating materials, $SrTiO_3$ (STO), $EuTiO_3$, and $CaMnO_3$ are not ferroelectric unless they are strained. When the latter metal compounds are stressed to a threshold level, typically between 100 MPa and several GPa, the electrically insulating materials are strained and become ferroelectric.

The strain may be induced by applying stress during device processing. This is referred to as process-induced strain. The induced strain may be tensile, compressive, substantially uniaxial or substantially biaxial. The stress may be applied, for example, by a liner layer or by epitaxial silicon germanium (SiGe) or carbon-doped silicon (Si:C) in the source and drain regions. In a preferred embodiment of the present invention. stress is applied to the electrically insulating materials substantially uniaxially by complementary metal-oxide-semiconductor (CMOS) technology-type techniques, so as to induce a strain that is substantially uniaxial. Substantially uniaxial stress is preferred because the stress level and direction can be chosen independently for different semiconductor devices in the integrated circuit. "Substantially uniaxial," as used herein, describes a strain introduced in one direction of a surface, such as an x-direction or a y-direction. This is in contrast to, for example, a biaxial strained film that has strain introduced in two directions (x-y) along its surface. It should be understood, however, that "substantially unaxially" may also describe strain primarily along one axis (e.g., the x-axis) with some minimal, "de minimis," or non-zero strain component along the other axis. In addition, "CMOS technology-type" techniques as described herein may include, for example, source/drain silicon germanium (SiGe) or carbon-doped silicon (Si:C) regions adjacent a silicon channel region, nitride liner formation, and combinations thereof.

For purposes of illustration and not limitation, the induced strain shown in FIGS. 1 to 4 is compressive and substantially uniaxial.

The integrated circuits according to the present invention are formed on a semiconductor substrate made from a semiconductor material. The semiconductor material may be any semiconductor material including but not limited to group IV semiconductors such as silicon, silicon germanium or germanium, a III-V compound semiconductor, or a II-VI compound semiconductor.

In each of FIGS. 1 to 4 which illustrate a portion of an integrated circuit, there are shown only three semiconductor devices although it should be understood that in practice, the integrated circuit will have many more semiconductor devices.

Referring to the Figures in more detail, and particularly referring to FIG. 1, there is shown a first embodiment of an integrated circuit 10 which includes semiconductor devices 12, 14, 16 formed in semiconductor substrate 18. Semiconductor device 12 includes a gate stack 20, sidewall spacers 24 adjacent to the gate stack 20, source region 28 and drain region 30. The semiconductor device 12 may be formed between shallow trench isolation regions 26. The gate stack 20 includes an electrically insulating material 22 which is ferroelectric as shown in semiconductor device 12. A stress is imposed on the gate stack 20 as indicated by arrow 29 to result in an induced strain which gives rise to a polarization state as indicated by arrow 32. The stress may be imposed by any type of process-induced means such as those mentioned above and is preferably substantially uniaxially applied. In the case of semiconductor device 12 in FIG. 1, the stress is imposed by silicon nitride layer 34.

Semiconductor device 14 is similar to semiconductor device 12 in that semiconductor device 14 includes a gate stack 20, sidewall spacers 24 adjacent to the gate stack 20, source region 28 and drain region 30. The semiconductor device 14 may be formed between shallow trench isolation regions 26. The gate stack 20 includes an electrically insulating material 22 which is ferroelectric as shown in semiconductor device 14. In a most preferred embodiment of the present invention, the electrically insulating material 22 in semiconductor device 14 is the same as electrically insulating material 22 in semiconductor device 12. A stress is imposed on the gate stack 20 as indicated by arrow 31 to result in an induced strain which gives rise to a polarization state as indicated by arrow 38. There is a different level of stress imposed on gate stack 20 of semiconductor device 14 to result in a different polarization state as represented by the different size of arrow 38 compared to arrow 32 of semiconductor device 12. The stress may be imposed by any type of process-induced means such as those mentioned above and is preferably uniaxially applied. In the case of semiconductor device 14 in FIG. 1, the stress is imposed by silicon nitride layer 34.

The different levels of stress imposed on gate stack 20 of semiconductor device 12 and gate stack 20 of semiconductor device 14 result in different polarization states and hence different Vt values. A particular advantage of the present invention is that Vt values ($Vt_1$ and $Vt_2$, respectively) for semiconductor devices 12, 14 are less variable and more predictable when compared to other methods of varying Vt values between semiconductor devices.

Integrated circuit 10 further includes a semiconductor device 16 which includes a gate stack 40, sidewall spacers 24 adjacent to the gate stack 40, source region 28 and drain region 30. The semiconductor device 16 may be formed between shallow trench isolation regions 26. The gate stack 40 in one embodiment includes an electrically insulating material 44 that may be ferroelectric when unstrained or may become ferroelectric when strain is induced. The electrically insulating material 44 in gate stack 40 is different than electrically insulating materials 22 in gate stacks 20 in semiconductor devices 12, 14. The gate stack 40 in one preferred embodiment is stressed as indicated by arrow 39 to result in an induced strain which gives rise to a polarization state as indicated by arrow 42. The stress imposed on gate stack 40 is less than the stress imposed on gate stacks 20 in semiconductor devices 12, 14 to result in a different polarization state as indicated by the size of arrow 42. In one preferred embodiment of the invention, the stress imposed on semiconductor device 16 may be a very minimal amount or zero. In another preferred embodiment of the present invention, the semiconductor device 16 does not contain the electrically insulating material 44 so that the gate stack 40 may not have any ferroelectric properties.

Regardless of whether semiconductor device 16 has an electrically insulating material that is or can be ferroelectric, the semiconductor device 16 will have a $Vt_3$ that is different from $Vt_1$, for semiconductor device 12 and $Vt_2$ for semiconductor device 14.

Figure 2:
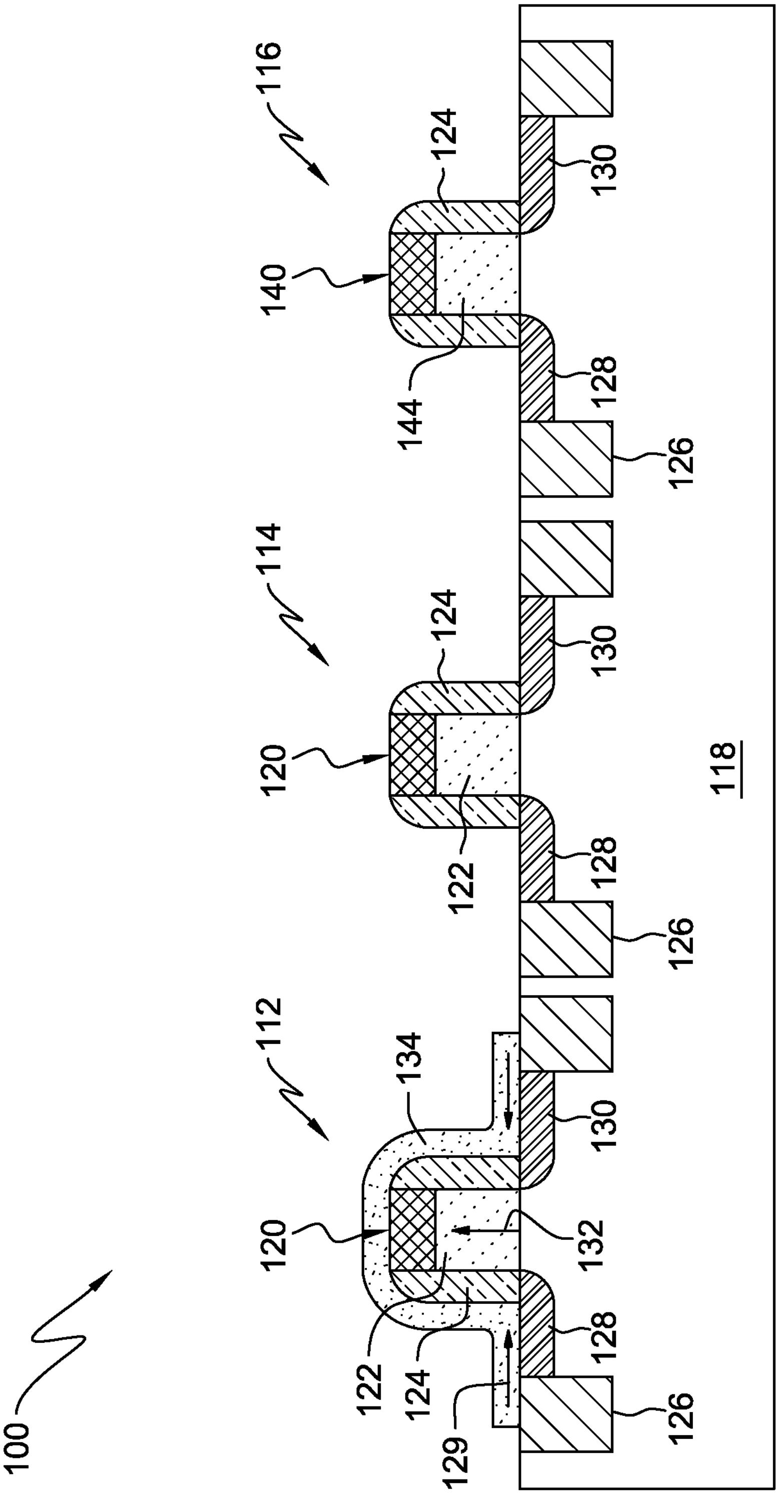
FIG. 2 is a cross sectional view of an integrated circuit having a gate stack including a ferroelectric material according to a second embodiment of the present invention.

Referring to FIG. 2, there is shown a second embodiment of an integrated circuit 100 which includes semiconductor devices 112, 114, 116 formed in semiconductor substrate 118. Semiconductor device 112 includes a gate stack 120, sidewall spacers 124 adjacent to the gate stack 120, source region 128 and drain region 130. The semiconductor device 112 may be formed between shallow trench isolation regions 126. The gate stack 120 includes an electrically insulating material 122 which is ferroelectric. A stress is imposed on the gate stack 120 as indicated by arrow 129 to result in an induced strain which gives rise to a polarization state as indicated by arrow 132. The stress may be imposed by any type of process-induced means such as those mentioned above and is preferably substantially uniaxially applied. In the case of semiconductor device 112 in FIG. 2, the stress is imposed by silicon nitride layer 134. Semiconductor device 112 has a threshold voltage $Vt_1$.

Semiconductor device 114 is similar to semiconductor device 112 in that semiconductor device 114 includes a gate stack 120, sidewall spacers 124 adjacent to the gate stack 120, source region 128 and drain region 130. The semiconductor device 114 may be formed between shallow trench isolation regions 126. The gate stack 120 includes an electrically insulating material 122 which is not ferroelectric as shown in semiconductor device 114. In a most preferred embodiment of the present invention, the electrically insulating material 122 in semiconductor device 114 is the same as electrically insulating material 122 in semiconductor device 112. However, gate stack 120 (and hence electrically insulating material 122) in semiconductor device 114 is unstressed. Semiconductor device 114 has a threshold voltage $Vt_2$.

Due to the stress imposed on gate stack 120 of semiconductor device 112 and no stress (or at least very minimal stress) imposed on gate stack 120 of semiconductor device 114, $Vt_1$ will be different from $Vt_2$ by some predetermined amount which can be calculated from their different polarization values.

Integrated circuit 100 further includes a semiconductor device 116 which includes a gate stack 140, sidewall spacers 124 adjacent to the gate stack 140, source region 128 and drain region 130. The semiconductor device 116 may be formed between shallow trench isolation regions 126. The gate stack 140 in one embodiment includes an electrically insulating material 144 that may be ferroelectric or may become ferroelectric when stressed. The electrically insulating material 144 in gate stack 140 is different than electrically insulating materials 122 in gate stacks 120 in semiconductor devices 112, 114. The gate stack 140 in one preferred embodiment is unstressed (or at least very minimal stress). In another preferred embodiment of the present invention, the gate stack 140 containing the electrically insulating material 144 may be stressed. In yet another preferred embodiment of the present invention, the semiconductor device 116 does not contain the electrically insulating material 144 so that the gate stack 140 may not have any ferroelectric properties.

Regardless of whether semiconductor device 116 has an electrically insulating material that is or can be ferroelectric, the semiconductor device 116 will have a $Vt_3$ that is different from $Vt_1$, for semiconductor device 112 and $Vt_2$, for semiconductor device 114.

Figure 3:
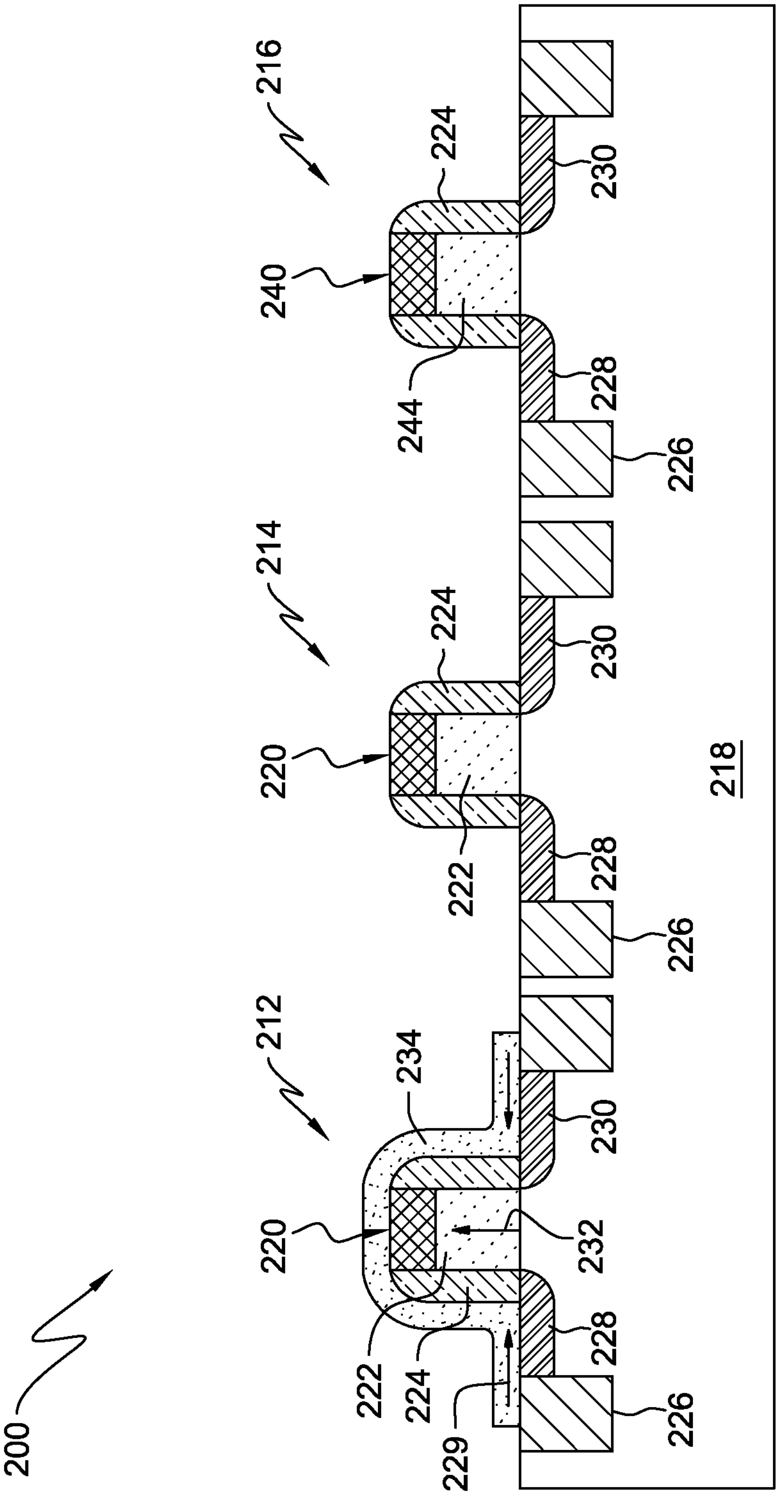
FIG. 3 is a cross sectional view of an integrated circuit having a gate stack including a ferroelectric material according to a third embodiment of the present invention.

Referring to FIG. 3, there is shown a third embodiment of an integrated circuit 200 which includes semiconductor devices 212, 214, 216 formed in semiconductor substrate 218. Semiconductor device 212 includes a gate stack 220, sidewall spacers 224 adjacent to the gate stack 220, source region 228 and drain region 230. The semiconductor device 212 may be formed between shallow trench isolation regions 226. The gate stack 220 includes an electrically insulating material 222 which is not ferroelectric until it is stressed above a certain level to induce ferroelectricity. A stress of sufficient magnitude is imposed on the gate stack 220 as indicated by arrow 229 to induce ferroelectricity in the electrically insulating material 222. The polarization state of the ferroelectric electrically insulating material 222 is indicated by arrow 232. The stress may be imposed by any type of process-induced means such as those mentioned above and is preferably substantially uniaxially applied. In the case of semiconductor device 212 in FIG. 3, the stress is imposed by silicon nitride layer 234. Semiconductor device 212 has a threshold voltage $Vt_1$.

Semiconductor device 214 is similar to semiconductor device 212 in that semiconductor device 214 includes a gate stack 220, sidewall spacers 224 adjacent to the gate stack 220, source region 228 and drain region 230. The semiconductor device 214 may be formed between shallow trench isolation regions 226. The gate stack 220 includes an electrically insulating material 222 which is not ferroelectric until it is stressed above a certain level to induce ferroelectricity. In a most preferred embodiment of the present invention, the electrically insulating material 222 in semiconductor device 214 is the same as electrically insulating material 222 in semiconductor device 212. However, gate stack 220 (and hence electrically insulating material 222) in semiconductor device 214 is unstressed or at least stressed at a low enough level that ferroelectricty is not induced in electrically insulating material 222. Semiconductor device 114 has a threshold voltage $Vt_2$.

Due to the stress imposed on gate stack 220 of semiconductor device 212 and no stress or low stress below the ferroelectricity threshold imposed on gate stack 220 of semiconductor device 214, $Vt_1$ will be different from $Vt_2$ by some predetermined amount which can be calculated from their different polarization values.

Integrated circuit 200 further includes a semiconductor device 216 which includes a gate stack 240, sidewall spacers 224 adjacent to the gate stack 240, source region 228 and drain region 230. The semiconductor device 216 may be formed between shallow trench isolation regions 226. The gate stack 240 in one embodiment includes an electrically insulating material 244 that may be ferroelectric or may become ferroelectric when stressed. The electrically insulating material 244 in gate stack 240 is different than electrically insulating materials 222 in gate stacks 220 in semiconductor devices 212, 214. The gate stack 240 in one preferred embodiment is unstressed or at a stress insufficient to induce ferroelectricity in electrically insulating material 244. In another preferred embodiment of the present invention, the gate stack 240 having the electrically insulating material 244 is stressed sufficiently to induce ferroelectricity. In yet another preferred embodiment of the present invention, the semiconductor device 216 does not contain the electrically insulating material 244 so that the gate stack 240 may not have any ferroelectric properties.

Regardless of whether semiconductor device 216 has an electrically insulating material that is or can be ferroelectric, the semiconductor device 216 will have a $Vt_3$ that is different from $Vt_1$ for semiconductor device 212 and $Vt_2$ for semiconductor device 214.

Figure 4:
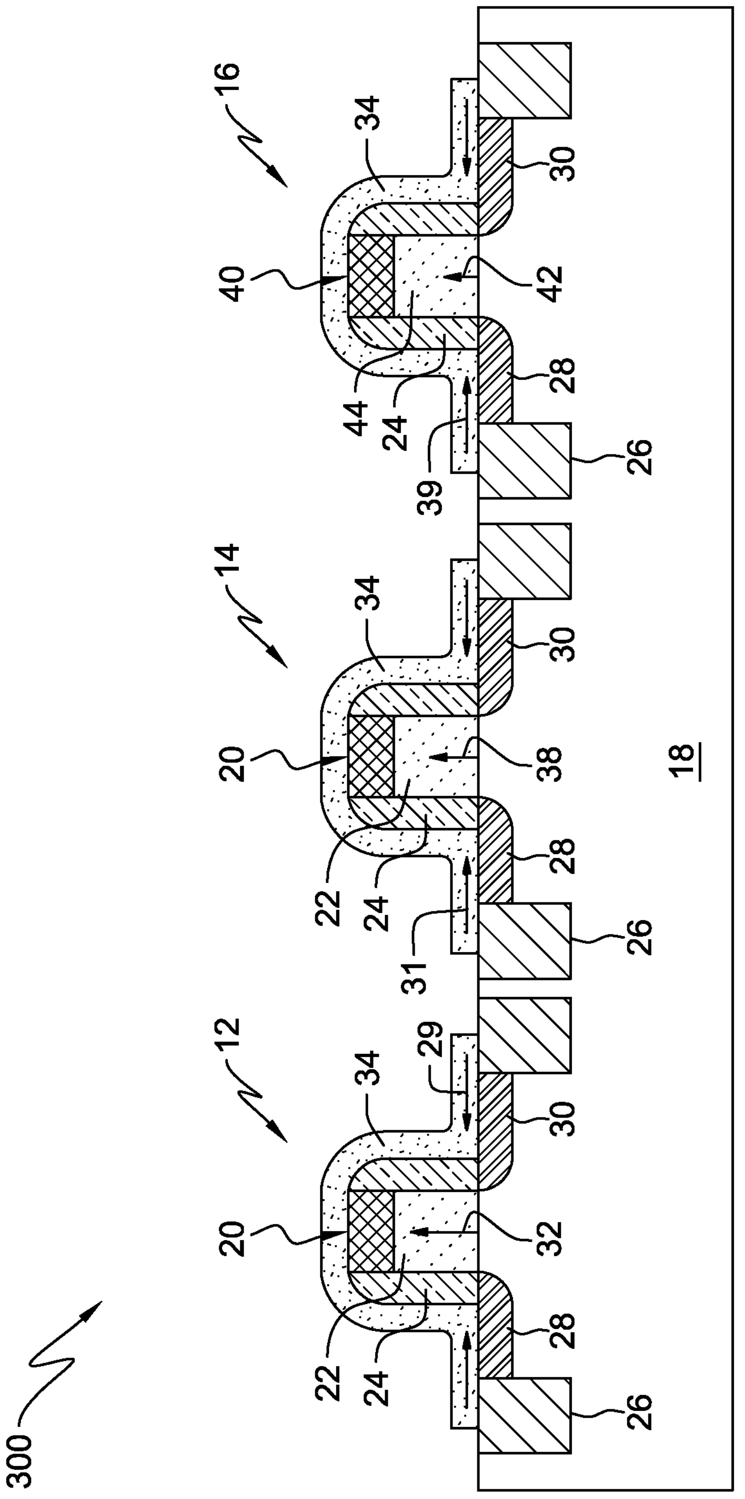
FIG. 4 is a cross sectional view of an integrated circuit having a gate stack including a ferroelectric material according to a fourth embodiment of the present invention.

Referring now to FIG. 4, there is shown a fourth embodiment of an integrated circuit 300. Integrated circuit 300 is similar to integrated circuit 10 previously discussed with respect to FIG. 1 but differs in several respects. Electrically insulating material 44 of semiconductor device 16 is the same as electrically insulating materials 22 of semiconductor devices 12, 14. All of electrically insulating materials 22, 44 are ferroelectric. In addition, a process-induced stress is imposed on semiconductor device 16 as indicated by arrow 42. For purposes of illustration and not limitation, the process-induced stress is imposed on all of the semiconductor devices 12, 14, 16 by silicon nitride layer 34 as indicated as arrows 29, 31, 39, respectively, to result in different induced strain levels which gives rise to different polarization states 32, 38, 42, respectively. The process-induced stress is varied between the semiconductor devices 12, 14, 16 so that the most stress is imposed on semiconductor device 12, followed by the next most stress on semiconductor device 14 and then the least amount of stress on semiconductor device 16. The result is three different values of the threshold voltage, that is, $Vt_1$, $Vt_2$ and $Vt_3$, corresponding to the three different levels of stress imposed on the semiconductor devices 12, 14, 16.

Figure 5:
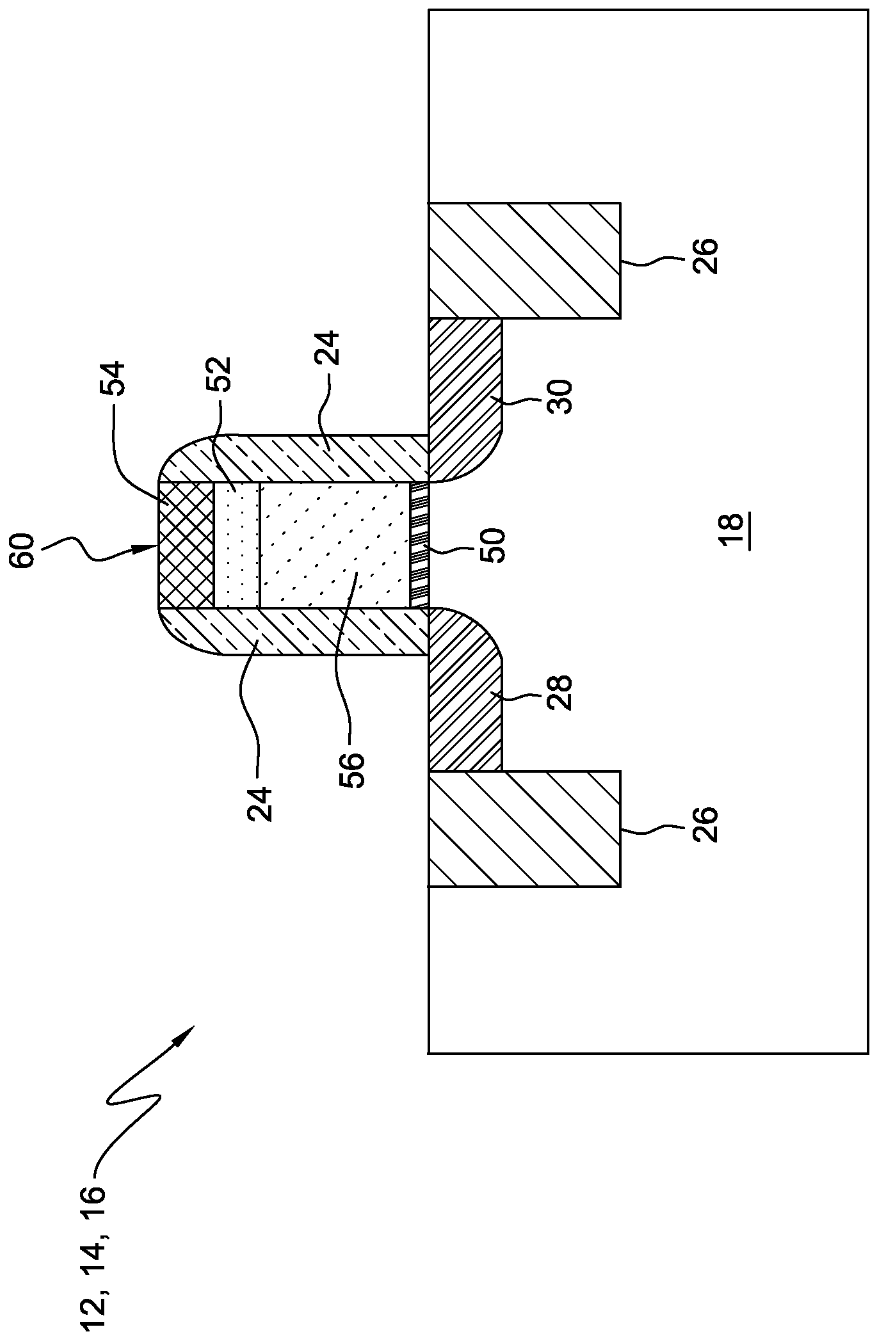
FIG. 5 is an enlarged cross sectional view of a semiconductor device having a gate stack according to the present invention.

Referring now to FIG. 5, there is shown an enlarged cross section of a semiconductor device. For purposes of illustration and not limitation, the semiconductor device shown may be semiconductor device 12, 14, or 16 in FIG. 1 but is also representative of any of the semiconductor devices in FIGS. 1 to 4. FIG. 5 shows the gate stack 60 in more detail. On either side of the gate stack 60 are spacers 24. The gate stack may include an interfacial layer 50 of $SiO_2$, silicon oxynitride (SiON), or any other dielectric material. Interfacial layer 50 is often present during the formation of the gate stack but is not required for the present invention. The gate stack may further include electrically insulating material layer 56. In the embodiments of the present invention discussed previously, electrically insulating material layer 56 may be a ferroelectric in the unstrained state or an electrically insulating material that is capable of becoming a ferroelectric when stressed above a certain level. In certain embodiments of the present invention, for example certain embodiments of semiconductor device 16, electrically insulating material layer 56 may not be present. The gate stack 60 may include a dielectric layer 52. Lastly, gate stack 60 may further include a gate electrode layer 54 which may be a conductive material or a combination of conductive materials, for example, doped polycrystalline silicon, an elemental or compound metal, or combinations or multilayers thereof.

The semiconductor devices as described with respect to FIGS. 1 to 4 form an integrated circuit. Some of the semiconductor devices may be integrated devices and others of the semiconductor devices may be random access memory devices such as static random access memory (SRAM) or dynamic random access memory (DRAM). In one preferred embodiment of the present invention, all of the semiconductor devices may be field-effect transistors (FETs). An important aspect of the present invention is that the present inventors have disclosed a methodology for achieving multiple Vt values so that the different Vt requirements of logic and random access memory devices are addressed in a predictable way.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. An integrated circuit comprising:

a first field-effect transistor having a gate stack comprising a first electrically insulating material that is ferroelectric and a first level of strain, S1, being induced in the first field-effect transistor gate stack by an element exterior to the first field-effect transistor, the first field-effect transistor having a first threshold voltage, $Vt_1$;

a second field-effect transistor having a gate stack comprising a second electrically insulating material that is ferroelectric and a second level of strain, S2, being induced in the second field-effect transistor gate stack by an element exterior to the second field-effect transistor, the second field-effect transistor having a second threshold voltage, $Vt_2$; and a third field-effect transistor having a gate stack comprising a third electrically insulating material that is ferroelectric and is different from the first and second electrically insulating materials and a third level of strain, S3, equaling zero and being induced in the third field-effect transistor gate stack, the third field-effect transistor having a third threshold voltage, $Vt_3$, wherein at least S1 is greater than zero, wherein the first and second electrically insulating materials are the same electrically insulating material and wherein the first and second electrically insulating materials and the first, second, and third levels of strain S1, S2, and S3, are configured to shift at least one of the first, second, and third threshold voltages $Vt_1$, $Vt_2$, and $Vt_3$ relative to each other by a predetermined amount such that $Vt_1$, $Vt_2$, and $Vt_3$ are all set to different predetermined values.

2. The integrated circuit of claim 1 wherein the strain induced in the gate stacks of the first and second field-effect transistors is biaxial strain.

3. The integrated circuit of claim 1 wherein S1 is greater than S2.

4. The integrated circuit of claim 1 wherein S1 is greater than S2 which is greater than S3.

5. The integrated circuit of claim 1 wherein one of the first and second electrically insulating materials that is ferroelectric is ferroelectric when it is unstrained.

6. The integrated circuit of claim 1 wherein the ferroelectric material of the first and second field-effect transistors is selected from the group consisting of $BaTiO_3$, $Pb[Zr_xTi_{1-x}]O_3$ (PZT), $SrBi_2Ta_2O_9$ (SBT), $SrTiO_3$ (STO), $Ba_{1-x}Sr_xTiO_3$ (BST), $PbTiO_3$, $EuTiO_3$, $CaMnO_3$ and $BiFeO_3$.

7. An integrated circuit comprising:

a first field-effect transistor having a gate stack comprising a first ferroelectric material and a first level of strain, S1, being induced in the first field-effect transistor gate stack by an element exterior to the first field-effect transistor gate stack, the first field-effect transistor having a first threshold voltage, $Vt_1$;

a second field-effect transistor having a gate stack comprising a second ferroelectric material and a second level of strain, S2, being induced in the second field-effect transistor gate stack by an element exterior to the second field-effect transistor gate stack, the second field-effect transistor having a second threshold voltage, $Vt_2$; and a third field-effect transistor having a gate stack comprising a third ferroelectric material and a third level of strain, S3, being induced in the third field-effect transistor gate stack, the third field-effect transistor having a third threshold voltage, $Vt_3$, wherein at least S1 is greater than zero, wherein the first and second ferroelectric materials are the same, the third ferroelectric material is different from the first and second ferroelectric materials, and wherein the first and second ferroelectric materials and the first, second and third levels of strain, S1, S2 and S3 are configured to shift at least $Vt_1$ and $Vt_2$ relative to each other and to $Vt_3$ by a predetermined amount such that $Vt_1$, $Vt_2$ and $Vt_3$ are all set to different predetermined values.

8. The integrated circuit of claim 7 wherein the strain induced in the gate stacks of the first, second and third field-effect transistors is substantially uniaxial process-induced strain and wherein S1, S2 and S3 are all greater than zero.

9. A method of forming an integrated circuit comprising the steps of:

selecting a first field-effect transistor having a gate stack comprising a first electrically insulating material that is ferroelectric;

imposing a first level of stress, S1, by an element exterior to the first field-effect transistor on the first field-effect transistor gate stack, the first field-effect transistor having a first threshold voltage, $Vt_1$, wherein S1 is greater than zero;

selecting a second field-effect transistor having a gate stack comprising a second electrically insulating material that is ferroelectric;

imposing a second level of stress, S2, by an element exterior to the second field-effect transistor on the second field-effect transistor gate stack, the second field-effect transistor having a second threshold voltage, $Vt_2$, wherein S2 is greater than zero;

selecting a third field-effect transistor having a gate stack comprising a third electrically insulating material that is ferroelectric and is different from the first and second electrically insulating materials;

imposing a third level of stress, S3, on the third field-effect transistor gate stack such that S3 equals zero, the third field-effect transistor having a third threshold voltage, $Vt_3$, wherein the first and second electrically insulating materials are the same electrically insulating material and wherein the first, second and third levels of stress are configured to shift at least one of $Vt_1$, $Vt_2$ and $Vt_3$ relative to each other by a predetermined amount such that $Vt_1$, $Vt_2$ and $Vt_3$ are all stabilized to different predetermined values.

* * * * *